United States Patent [19]

Arndt et al.

[11] 3,772,770

[45] Nov. 20, 1973

[54] METHOD OF MANUFACTURING A SEMICONDUCTOR DEVICE

[75] Inventors: Heinz-Herbert Arndt; Franz Belke, both of Heilbronn-Bockingen, Germany

[73] Assignee: Licentia, Patent-Verwaltungs-G.m.b.H., Frankfurt am Main, Germany

[22] Filed: Sept. 28, 1971

[21] Appl. No.: 184,426

[30] Foreign Application Priority Data

Oct. 2, 1970 Germany .................. P 20 48 451.9

[52] U.S. Cl. .................................... 29/583, 29/591

[51] Int. Cl. ........................................... B01j 17/00

[58] Field of Search ...................... 29/580, 583, 591; 53/267

[56] References Cited

UNITED STATES PATENTS

| | | | |
|---|---|---|---|
| 2,296,575 | 9/1942 | Rowley et al. | 29/583 |
| 2,784,479 | 3/1957 | Roberts | 29/583 |
| 3,334,451 | 8/1967 | Hutton | 51/267 |

*Primary Examiner*—Charles W. Lanham
*Assistant Examiner*—W. C. Tupman
*Attorney*—George H. Spencer et al.

[57] ABSTRACT

A method of manufacturing a semiconductor device, in particular a solar cell, in which after deposition of an electrode which approaches an edge of the semiconductor body on which it is deposited, the side surface next to that edge of the body is ground away to remove any electrode material which has been deposited thereon.

6 Claims, 3 Drawing Figures

METHOD OF MANUFACTURING A SEMICONDUCTOR DEVICE

BACKGROUND OF THE INVENTION

The invention relates to a method for manufacturing a semiconductor device, in particular a solar cell, with a *p-n* junction parallel to the large area surfaces of a semiconductor body, in which after the production of the *p-n* junction a large area electrode for contacting the semiconductor zones forming this *p-n* junction is made on the one large area surface of the semiconductor body, and an electrode on the opposite large area surface which extends immediately adjacent to one side surface of the semiconductor body.

In known solar cells with a semiconductor body of silicon the electrode consists, for example, of superimposed layers of titanium and silver which are applied by evaporation in a high vacuum by means of a mask. During a further process step these layers may be tin plated wholly or partially. During the application of the metal electrodes by evaporation, the side surfaces of the semiconductor body may frequently receive a vaporized deposit at the points where the metal must be applied directly up to the edge of the large area surface of the semiconductor body. This causes a short circuit of the *p-n* junction exposed on the surface of the side face, rendering the solar cell useless.

Although such a short circuit could be prevented by carefully covering the side faces during the evaporation, this would require a highly accurate adjustment of the solar cells relative to the masks and would, therefore, be uneconomical. Another possibility is to eliminate undesirable edge short circuits subsequently by covering the electrodes with a suitable substance, and removing the short circuiting material from the side faces by etching with a suitable solvent. However, such a method is also uneconomical because it requires a number of steps such as, e.g., covering, etching, washing, drying, removal of the cover, etc. In addition, there is the danger of etching below the cover, and this leads to strong fluctuations of the quality.

The invention has the object of providing a method for manufacturing a solar cell in which the disadvantages mentioned above have been eliminated.

SUMMARY OF THE INVENTION

According to the invention, there is provided a method of manufacturing a semiconductor device, comprising the steps of forming a *p-n* junction in a planar semiconductor body, which junction extends parallel with the plane of the body and reaches a lateral edge of the body, applying an electrode structure to a surface of the body, which structure extends also to said lateral edge, and grinding away the side surface of the body at that edge to remove at least any material deposited thereon by said evaporation step without a further step of etching.

BRIEF DESCRIPTION OF THE DRAWINGS

The invention will now be described in greater detail, by way of example, with reference to the accompanying drawings, in which.

DESCRIPTION OF THE PREFERRED EMBODIMENT

The invention proposes in a method for manufacturing a solar cell, that at least the side face of the semiconductor body which is adjacent to the bus of a comb shaped electrode, is ground after the application of the electrodes without subsequent etching of the semiconductor body. During this process undesirable metal on the side face of the semiconductor body having generally a rectangular cross-section, is removed.

The semiconductor body of the solar cell is preferably ground wet. It is recommended to grind the side face of the semiconductor body at an angle to the large area faces of the semiconductor body. This angle amounts generally to at least 5°. Preferably, the average grain of the grinding medium used for the grinding is smaller than 20 u. According to a further feature of the invention, the semiconductor is ground in such a way that no semiconductor material of the semiconductor zone contacted by the comb-shaped electrode remains between the bus and the side face. Generally, however, a bus applied by evaporation extends, owing to the fact that it is difficult to limit, immediately after the application not only over the surface of the semiconductor provided therefor, but also over the adjacent side face, so that after the grinding off of the side face or of the metal layer located thereon, the condition is always fulfilled that no semiconductor material of the semiconductor zone contacted by the comb-shaped electrode remains between the bus and the adjacent side face, and this side face and one edge of the bus are located in one plane.

Figure 2:
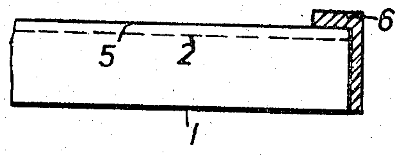
FIG. 2 shows a section through a cell under manufacture, in which the electrode extends onto the side surface of the cell.
Figure 3:
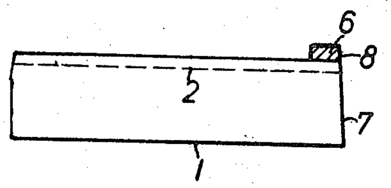
FIG. 3 shows a section as in FIG. 2 after the grinding.

The invention will be described with reference to the specific embodiment shown in FIGS. 1 to 3.

Figure 1:
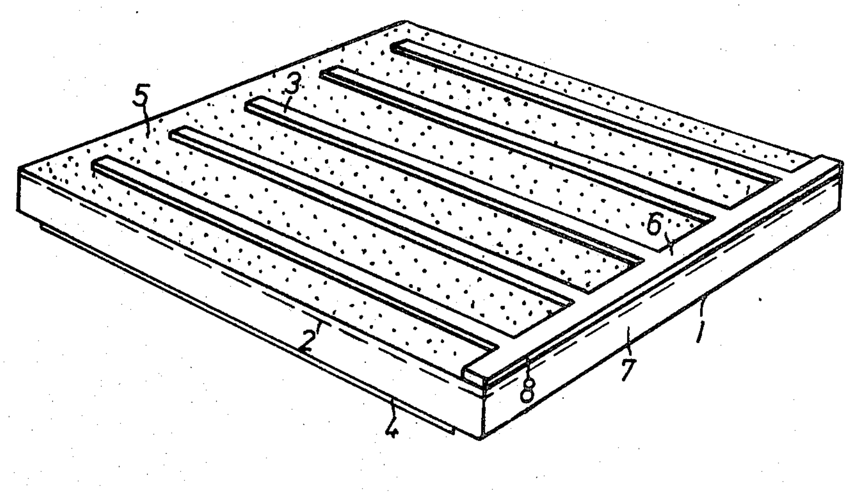
FIG. 1 is a perspective view of a solar cell.

The solar cell of FIG. 1 consists of a semiconductor body 1 with a *p-n* junction 2, a comb-shaped electrode 3, and a large area electrode 4. For making the *p-n* junction 2, a semiconductor region is diffused, for example, into the one large area side 5 of the semiconductor body 1, consisting for example of silicon, wherein this semiconductor region has a conductivity opposite to that of the semiconductor body. After the manufacture of the *p-n* junction 2, the electrodes 3 and 4 are applied by evaporation by means of masks. As shown in FIG. 1, the comb-shaped electrode 2 consists of several contact strips which are contacted by a so-called bus 6. Between the contact strips the semiconductor surface is exposed and the exposed zone receives incident light and forms the active area of the solar cell.

FIG. 1 also shows that the bus 6 of the comb-shaped electrode 3 extends to the edge of the large area side 5 and, therefore, up to the side face 7. However, such an arrangement brings about the danger that during the manufacture of the comb-shaped electrode 3 by evaporation, electrode material may reach onto the side face 7 and may thereby short circuit the *p-n* junction 2, there exposed, as shown in FIG. 2.

For the subsequent elimination of such a short circuit, a secmidoncutor body 1 is ground laterally according to the invention, and this without any otherwise conventional subsequent treatment, such as, e.g., etching. Although a grinding treatment of semiconductor bodies with a view to producing a certain configuration is known, this entails always a destruction of the semiconductor surface, requiring the subsequent removal of the resulting lattice faults, e.g., by chemical removal. This is true particularly for the case where the lattice faults effect the region of a *p-n* junction.

The invention is based on the discovery that such a subsequent treatment, e.g. etching, is not necessary in the present case if the average grain of the grinding agent used does not exceed a certain value, namely 20 u, and if a second condition is fulfilled, namely that the semiconductor body is ground wet.

The method in accordance with the invention may be carried out, for example, using commercially available wet grinding paper as grinding agent, wetted with water, the solar cells being guided individually, or several combined, in a suitable device or by hand, with the side face to be treated over the grinding paper. Although generally that side face 7 of the solar cell which is adjacent to the bus 6 and extends parallel thereto will be most affected during the evaporation, it is recommended in some cases to grind not only this side face but also the other side faces of the semiconductor body in accordance with the invention.

According to a further feature of the invdntion, the grinding removes not only undesirable electrode material from the side face of the semiconductor body, but also semiconductor material, so that no active surface or semiconductor material of the semiconductor region contacted by the comb-shaped electrode 3 remains between the bus 6 and the side face 7, or the edge of the solar cell adjacent to the bus 6. The side face 7 and the one edge 8 of the bus 6 should, therefore, be in one plane, a condition which is met, for example, by the arrangement in accordance with FIG. 3, showing the solar cell after the grinding.

However, investigations have shown that the metal layer located on the side face can partially not be removed by grinding, but remains attached to the edge of the semiconductor body if the semiconductor body is ground at right angles to its large area surfaces. In order to avoid this from happening, the invention further proposes that the grinding should be oblique as shown in FIG. 3, namely at a certain angle relative to the large area surfaces of the semiconductor body. This angle should preferably not be below 5°.

It will be understood that the above description of the present invention is susceptible to various modification changes and adaptations.

What is claimed is:

1. A method of manufacturing a silicon solar cell comprising the following steps:

a. forming a p-n junction in a planar silicon body parallel with the plane thereof, said *p-n* junction extending to a lateral edge of said body;

b. depositing an electrode structure to a surface of said body, said electrode structure extending to said lateral edge; and c. removing the side surface at said lateral edge of said silicon body solely by wet grinding with a grinding agent having an average grain size of less than 20$\mu$to dislodge at least any electrode material bonded thereto as a result of said depositing step.

2. A method as defined in claim 1 the side surface is ground at an angle relative to the normal side-surface of the semiconductor body.

3. A method as defined in claim 2 wherein said angle is at least 5°.

4. A method as defined in claim 1 wherein the wet grinding is carried out in such a manner that no semiconductor material of the semiconductor region contacted by the electrode remains between it and the side surface.

5. A method as defined in claim 19 wherein the electrode structure is deposited by evaporation.

6. A method as defined in claim 1, wherein the electrode is comb-shaped, the bus of which extends along said lateral edge.

* * * * *